US008367471B2

(12) United States Patent
Pratt

(10) Patent No.: US 8,367,471 B2
(45) Date of Patent: Feb. 5, 2013

(54) SEMICONDUCTOR ASSEMBLIES, STACKED SEMICONDUCTOR DEVICES, AND METHODS OF MANUFACTURING SEMICONDUCTOR ASSEMBLIES AND STACKED SEMICONDUCTOR DEVICES

(75) Inventor: David S. Pratt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 630 days.

(21) Appl. No.: 11/764,066

(22) Filed: Jun. 15, 2007

(65) Prior Publication Data

US 2008/0308946 A1 Dec. 18, 2008

(51) Int. Cl.
*H01L 21/00* (2006.01)

(52) U.S. Cl. ........ 438/109; 438/110; 438/113; 438/107; 438/455; 438/460; 257/777; 257/686; 257/E23.141

(58) Field of Classification Search .................. 438/109, 438/110, 113, 107, 455, 460; 257/777, 686, 257/E23.141
See application file for complete search history.

(56) References Cited

U.S. PATENT DOCUMENTS

| | | | |
|---|---|---|---|
| 5,258,236 A | | 11/1993 | Arjavalingam et al. |
| 5,563,084 A | * | 10/1996 | Ramm et al. .................. 438/15 |
| 5,656,552 A | | 8/1997 | Hudak et al. |
| 5,719,449 A | | 2/1998 | Strauss |
| 6,294,837 B1 | | 9/2001 | Akram et al. |
| 6,338,980 B1 | | 1/2002 | Satoh |
| 6,362,529 B1 | | 3/2002 | Sumikawa et al. |
| 6,391,685 B1 | * | 5/2002 | Hikita et al. .................. 438/113 |
| 6,525,413 B1 | | 2/2003 | Cloud et al. |
| 6,555,400 B2 | | 4/2003 | Farnworth et al. |
| 6,579,748 B1 | | 6/2003 | Okuno et al. |
| 6,607,938 B2 | * | 8/2003 | Kwon et al. .................. 438/109 |
| 6,608,371 B2 | | 8/2003 | Kurashima et al. |
| 6,642,081 B1 | * | 11/2003 | Patti .............................. 438/109 |
| 6,657,309 B1 | | 12/2003 | Hikita et al. |
| 6,790,775 B2 | | 9/2004 | Fartash |

(Continued)

FOREIGN PATENT DOCUMENTS

| | | |
|---|---|---|
| EP | 1775768 | 4/2007 |
| JP | 11162885 A | 6/1999 |

(Continued)

OTHER PUBLICATIONS

International Search Report and Written Opinion for International Application No. PCT/US2008/065405, Oct. 6, 2008.

(Continued)

*Primary Examiner* — Junghwa M Im
(74) *Attorney, Agent, or Firm* — Perkins Coie LLP

(57) ABSTRACT

Stacked semiconductor devices, semiconductor assemblies, methods of manufacturing stacked semiconductor devices, and methods of manufacturing semiconductor assemblies. One embodiment of a semiconductor assembly comprises a thinned semiconductor wafer having an active side releasably attached to a temporary carrier, a back side, and a plurality of first dies at the active side. The individual first dies have an integrated circuit, first through die interconnects electrically connected to the integrated circuit, and interconnect contacts exposed at the back side of the wafer. The assembly further includes a plurality of separate second dies attached to corresponding first dies on a front side, wherein the individual second dies have integrated circuits, through die interconnects electrically connected to the integrated circuits and contact points at a back side, and wherein the individual second dies have a thickness of approximately less than 100 microns.

27 Claims, 10 Drawing Sheets

U.S. PATENT DOCUMENTS

| | | | |
|---|---|---|---|
| 6,835,589 B2 | 12/2004 | Pogge et al. | |
| 6,908,784 B1 * | 6/2005 | Farnworth et al. | 438/106 |
| 6,964,915 B2 | 11/2005 | Farnworth et al. | |
| 7,091,124 B2 | 8/2006 | Rigg et al. | |
| 7,145,228 B2 | 12/2006 | Yean et al. | |
| 7,247,934 B2 | 7/2007 | Pu | |
| 7,271,482 B2 | 9/2007 | Kirby | |
| 7,285,477 B1 * | 10/2007 | Bernstein et al. | 438/455 |
| 2002/0094602 A1 | 7/2002 | Her et al. | |
| 2004/0113283 A1 | 6/2004 | Farnworth et al. | |
| 2004/0115867 A1 | 6/2004 | Shibata | |
| 2004/0121563 A1 | 6/2004 | Farnworth et al. | |
| 2004/0178491 A1 | 9/2004 | Akram et al. | |
| 2004/0256734 A1 * | 12/2004 | Farnworth et al. | 257/777 |
| 2004/0262734 A1 | 12/2004 | Yoo | |
| 2005/0095814 A1 * | 5/2005 | Zhu et al. | 438/459 |
| 2005/0101116 A1 | 5/2005 | Tseng | |
| 2005/0104171 A1 | 5/2005 | Benson et al. | |
| 2005/0148160 A1 | 7/2005 | Farnworth et al. | |
| 2005/0181540 A1 | 8/2005 | Farnworth et al. | |
| 2005/0200028 A1 | 9/2005 | Farnworth et al. | |
| 2005/0227415 A1 | 10/2005 | Farnworth et al. | |
| 2005/0269700 A1 | 12/2005 | Farnworth et al. | |
| 2005/0270055 A1 | 12/2005 | Akram et al. | |
| 2005/0275750 A1 | 12/2005 | Akram et al. | |
| 2005/0287783 A1 | 12/2005 | Kirby et al. | |
| 2006/0043599 A1 | 3/2006 | Akram et al. | |
| 2006/0046471 A1 | 3/2006 | Kirby et al. | |
| 2006/0057776 A1 | 3/2006 | Tao | |
| 2006/0148250 A1 | 7/2006 | Kirby | |
| 2006/0183349 A1 | 8/2006 | Farnworth et al. | |
| 2006/0270108 A1 | 11/2006 | Farnworth et al. | |
| 2007/0093040 A1 | 4/2007 | Sekiya | |

FOREIGN PATENT DOCUMENTS

| | | |
|---|---|---|
| JP | 2001250836 A | 9/2001 |
| JP | 2003142647 A | 5/2003 |
| WO | WO-2006/019156 | 2/2006 |

OTHER PUBLICATIONS

Lee, R.A. et al., "Laser Created Silicon Vias for Stacking Dies in MCMs," IEEE/CHMT IEMT Symposium, 1991, pp. 262-265.

Sumitomo 3M Ltd., Product Description, H-WSS (Wafer Support System) for Ultra Thin Wafer Backgrinding, Sep. 1, 2003.

Office Action issued Apr. 13, 2011 in Republic of Korea Application No. 10-2010-7000878, 3 pages.

Office Action issued Sep. 27, 2011 in Japan Application No. 2010-512256, 8 pages.

Office Action issued Dec. 2, 2011 in Korea Application No. 10-2010-7000878, 14 pages.

Office Action issued Apr. 27, 2012 in R.O.C. (Taiwan) Application No. 097121441, 20 pages.

* cited by examiner

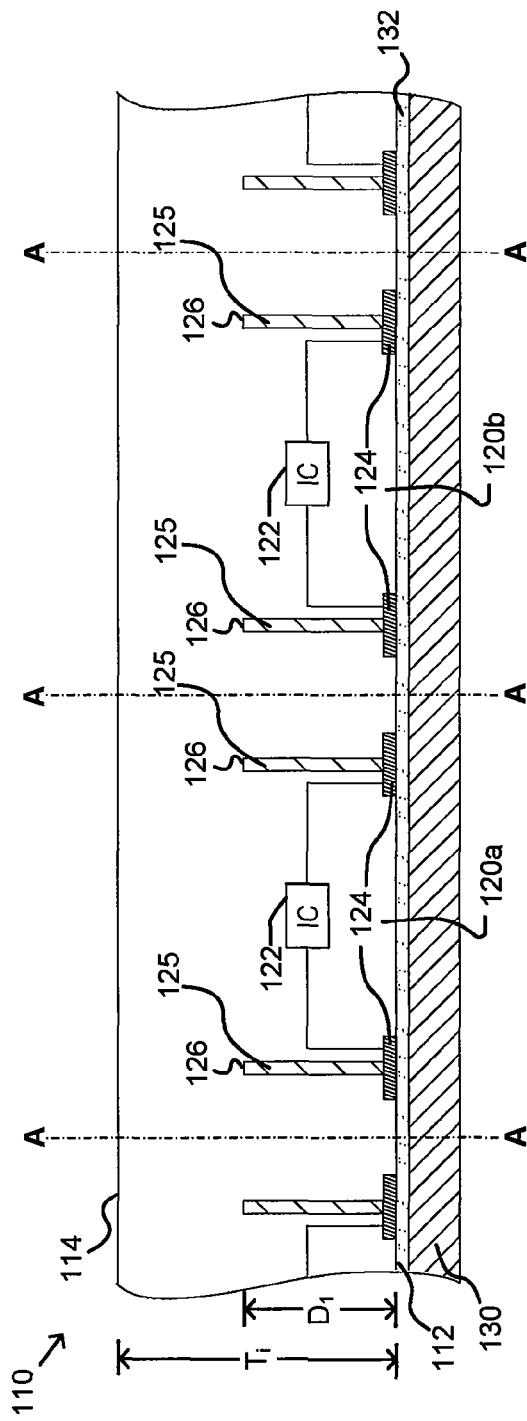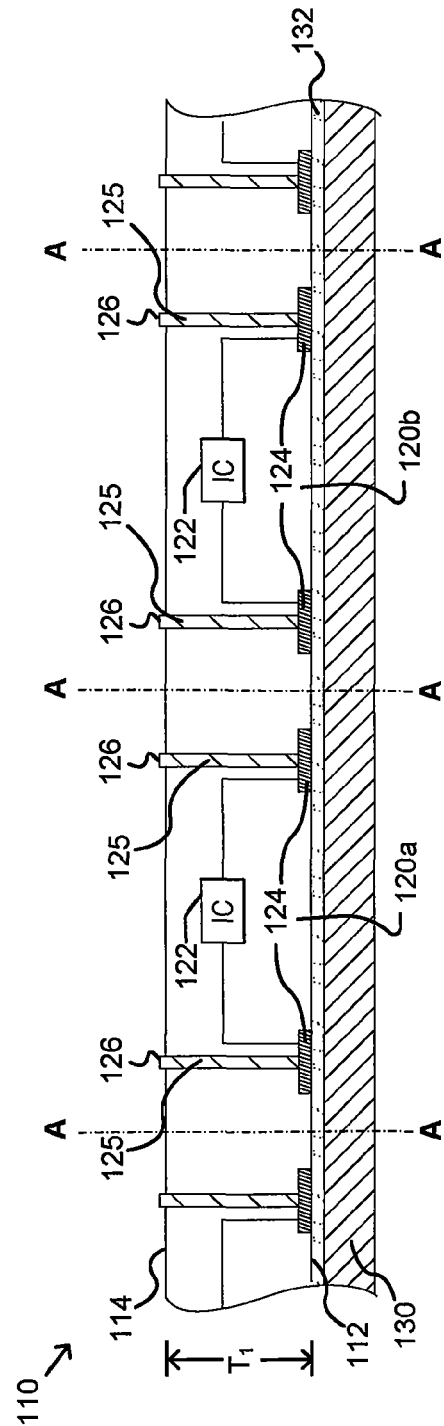

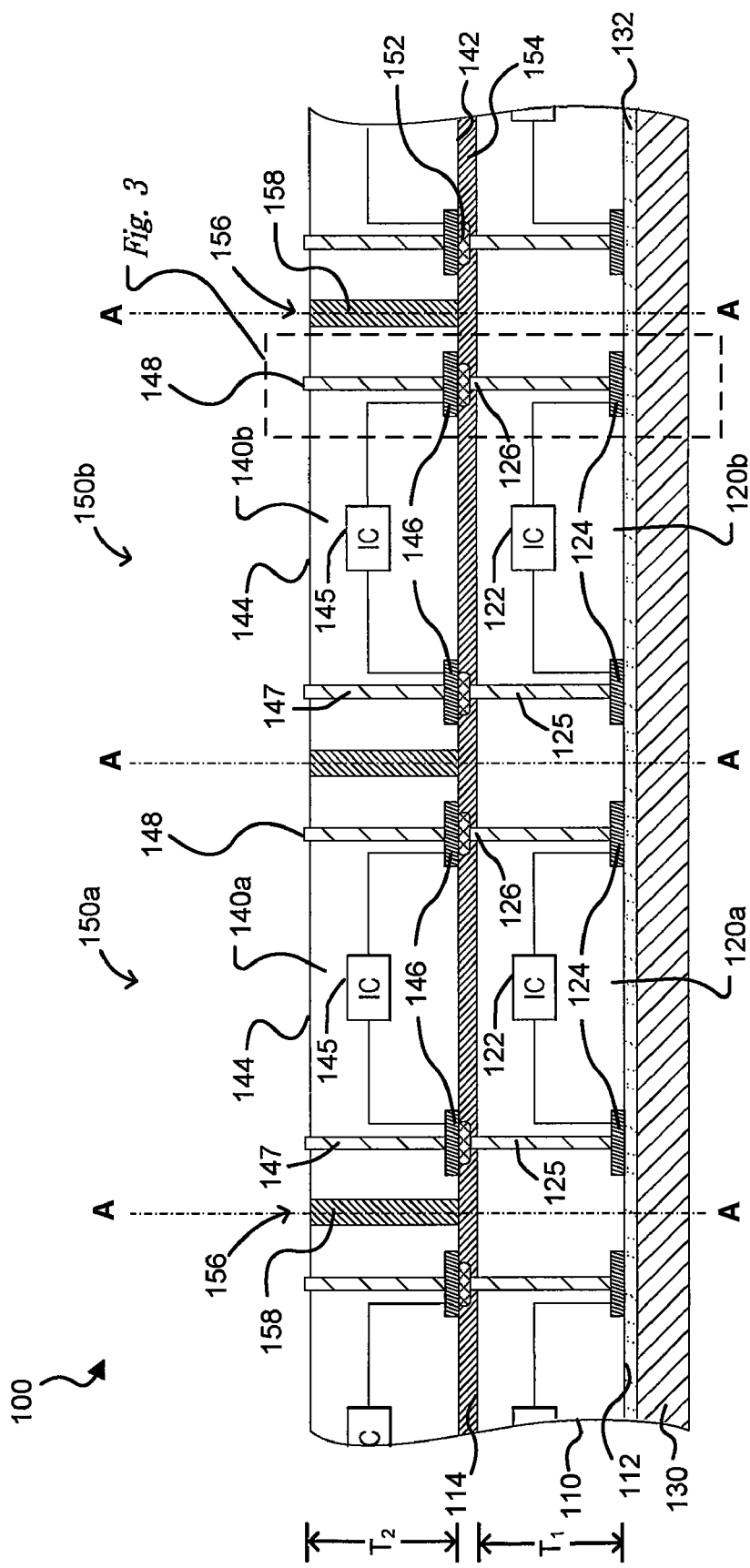

SEMICONDUCTOR ASSEMBLIES, STACKED SEMICONDUCTOR DEVICES, AND METHODS OF MANUFACTURING SEMICONDUCTOR ASSEMBLIES AND STACKED SEMICONDUCTOR DEVICES

TECHNICAL FIELD

The present invention is related to stacked semiconductor devices and methods for manufacturing stacked semiconductor devices.

BACKGROUND

Packaged semiconductor devices are utilized in cellular phones, pagers, personal digital assistants, computers and many other types of consumer or industrial electronic products. Microelectronics manufacturers are developing more sophisticated devices in smaller sizes. To meet current design criteria, semiconductor components have increasingly dense arrays of input/output terminals within decreasing "footprints" on printed circuit boards (i.e. the height and surface area the device occupies on a printed circuit board).

Semiconductor devices are typically fabricated on semiconductor wafers or other types of workpieces using methods that simultaneously process a large number of dies (i.e., chips). Microelectronic devices generally have a die that includes an integrated circuit having a high density of very small components. The dies typically include an array of bond-pads or other external electrical terminals for transmitting supply voltage, signals, etc. to and from the integrated circuitry. The bond-pads are usually very small and are assembled in dense arrays having fine pitches between bond-pads.

One technique to increase the density of microelectronic devices within a given footprint is stacking one microelectronic die on top of another. Through-substrate interconnects, for example, can electrically connect bond pads at a front side of a lower die with contacts at a back side of the lower die such that bond pads of a top die can be electrically coupled to the back side contacts of the lower die. An existing process for stacking such dies includes thinning first and second wafers by removing material from the back side of the wafers to (1) expose interconnect contact points on the back side of the dies, and (2) reduce the thickness of the dies. The second wafer is generally thinned to not less than 300 microns. After thinning, the second wafer is singulated (i.e., cut) and separate dies from the second wafer are stacked onto dies on the first wafer. An encapsulant is subsequently disposed between individual second dies, and the first wafer and encapsulant are cut to separate stacked devices.

BRIEF DESCRIPTION OF THE DRAWINGS

FIGS. 2A-2F are cross-sectional views schematically illustrating stages of a method for manufacturing semiconductor assemblies.

DETAILED DESCRIPTION

Specific details of several embodiments of the disclosure are described below with reference to semiconductor assemblies, stacked semiconductor devices, methods of manufacturing semiconductor assemblies, and methods of forming stacked semiconductor devices. The devices are manufactured on semiconductor wafers that can include substrates upon which and/or in which microelectronic devices, micromechanical devices, data storage elements, optics, read/write components, and other features are fabricated. For example, SRAM, DRAM (e.g., DDR/SDRAM), flash memory (e.g., NAND/memory), processors, imagers, and other types of devices can be constructed on semiconductor wafers. Although many of the embodiments are described below with respect to semiconductor wafers, other types of devices manufactured on other types of substrates (e.g., dielectric or conductive substrates) may be within the scope of the invention. Moreover, several other embodiments of the invention can have different configurations, components, or procedures than those described below in this section. A person of ordinary skill in the art, therefore, will accordingly understand that other embodiments of the invention may have additional elements, or still more embodiments may not have several of the features and elements shown and described below with reference to FIGS. 1-6.

Figure 1:
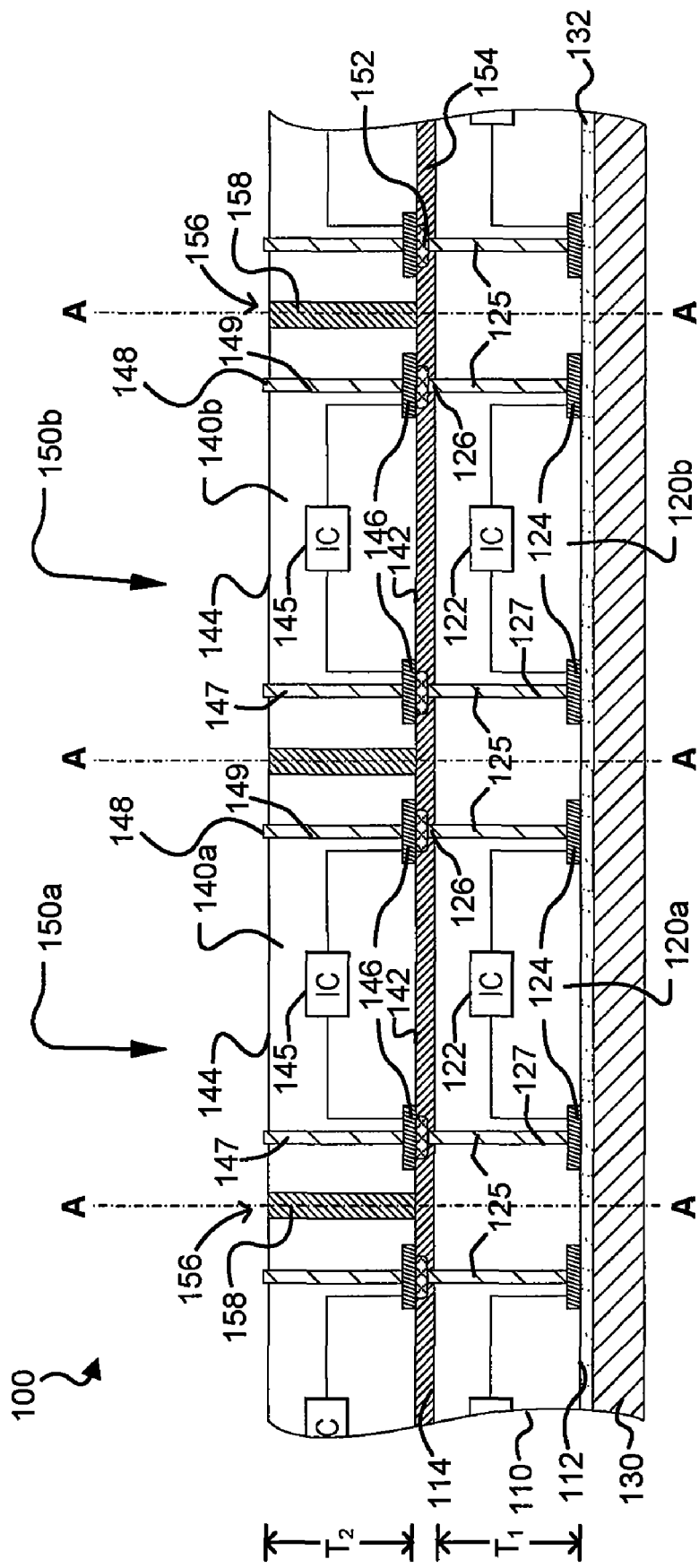
FIG. 1 is a cross-sectional view schematically illustrating stacked semiconductor devices in accordance with an embodiment of the invention.

FIG. 1 is a cross-sectional view that schematically illustrates a semiconductor assembly 100. In this embodiment, the semiconductor assembly 100 includes a semiconductor wafer 110 having a plurality of first microelectronic dies 120 (identified individually by reference numbers 120a and 120b), a temporary carrier 130 releasably attached to an active side 112 of the wafer 110, and a plurality of singulated second microelectronic dies 140 (identified individually by reference numbers 140a and 140b). Individual second dies 140a and 140b are attached to a back side 114 of the wafer 110 in a die pattern corresponding to the arrangement of the first dies 120a and 120b, respectively. The stacked first/second dies 120a/140a and 120b/140b form stacked microelectronic devices 150a and 150b, respectively. The wafer 110 can be releasably attached to the temporary carrier 130 (e.g. carrier substrate) using an adhesive layer 132 such as an adhesive film, epoxy, tape, paste, or other suitable material that secures the wafer 110 in place during processing. The adhesive 132 should have suitable release characteristics for removing the carrier 130 from the wafer 110 and/or stacked microelectronic devices 150 following singulation.

In the illustrated embodiment of the assembly 100, the first dies 120 are at the active side 112 of the wafer 110. Individual first dies 120 can include first integrated circuits 122 (shown schematically) and a plurality of first terminals 124 (e.g. bond pads) electrically coupled to the first integrated circuits 122 and exposed at the active side 112 of the wafer 110. In the specific embodiment shown, the first terminals 124 are in contact with the adhesive layer 132; however, in other arrangements, the individual first dies 120 may include a redistribution structure intermediate the first terminals 124 and the adhesive layer 132. The individual first dies 120 further include first through die interconnects 125 electrically coupling the first terminals 124 to corresponding first back side contacts 126. For example, the plurality of first dies 120 can have a first via 127 that extends through a final thickness $T_1$ of the wafer substrate 110 in alignment with at least a portion of the first terminals 124. The first via 127 can then be at least partially filled with a conductive material, such as copper, to form the first through die interconnect 125. The first interconnects 125 can accordingly carry electrical signals and power between the first terminals 124 and the first contacts 126. In some embodiments, the first dies 120 can be individually tested before attaching the temporary carrier 130 to the active side 112 of the wafer 110. From the test, a plurality of known good first dies 120a and a plurality of known bad first dies 120b can be determined and marked for reference.

In the embodiment shown in FIG. 1, the wafer 110 can be thinned to the final thickness $T_1$ through suitable processing steps such as back grinding, chemical-mechanical planarization, polishing, etc. Removing material from the back side 114 of the wafer 110 can expose the first back side contacts 126, and etching or other further processing can remove additional material from the back side 114 of the wafer 110 such that the exposed contacts 126 project beyond the back side 114 of the wafer 110. In some embodiments, thinning the wafer 110 can result in a final wafer thickness $T_1$ of approximately less than 100 microns. In other embodiments, the wafer thickness $T_1$ can be approximately less than 50 microns, and in further embodiments the wafer 110 can have a thickness $T_1$ of approximately 20 to 150 microns.

In the specific embodiment shown in FIG. 1, the second dies 140 can be the same as the first dies 120, or the second dies 140 can be different than the first dies 120. Individual second dies 140 can include a second active side 142, a second back side 144, a second integrated circuit 145, and second terminals 146 at the second active side 142 that are electrically coupled to the second integrated circuit 145. The separate second dies 140 can further include a plurality of second through die interconnects 147 extending through second vias 149 from the second terminals 146 at the second active side 142 to second backside contacts 148 at the second back side 144.

The plurality of second dies 140 have a final die thickness $T_2$. As illustrated, the final die thickness $T_2$ of the individual second dies 140 is uniform. Furthermore, the conductive material of the second through die interconnects 147 extends beyond the thickness $T_2$ to provide stud-shaped second contacts 148 at the second back side 144 of the second dies 140. The second die thickness $T_2$ can be approximately less than 100 microns. In other embodiments, however, the final second die thickness $T_2$ can be approximately less than 50 microns, and in further embodiments, the plurality of second dies 140 can have a final thickness $T_2$ of approximately 20 to 150 microns.

The second dies 140 are attached to the corresponding first dies 120 such that the second terminals 146 are electrically coupled to the first contacts 126 at the back side 114 of the wafer 110. Before mounting the second dies 140, a soft malleable metal, such as nickel with aluminum, can be plated through under bump metallurgy (UBM) processing to form plated pads 152 at the second active side 142 of the second dies 140. UBM aluminum plated pads 152 can form suitable electrical connections with copper and other electrically conductive materials used to form the first and second through die interconnects 125, 147. The UBM plated pads 152, in conjunction with the stud-shaped first contacts 126, space the second dies 140 apart from the back side 114 of the wafer 110 by a stand-off height. An underfill material 154 can be disposed between the back side 114 of the wafer 110 and the plurality of stacked second dies 140 to fill the stand-off space and provide support for the stacked second dies 140.

Before stacking the second dies 140 onto the first dies 120, the second dies 140 can also be individually tested to determine known good second dies 140a and known bad second dies 140b. As shown in FIG. 1, known good second dies 140a are mounted to corresponding known good first dies 120a to form a plurality of known good stacked devices 150a. Likewise, known bad second dies 140b are mounted to corresponding known bad first dies 120b to form known bad stacked devices 150b.

The singulated second dies 140 are spaced apart from each other creating a plurality of gaps 156. In the illustrated embodiment, an encapsulant material 158 (e.g., an epoxy) is disposed in the gaps 156 between the second dies 140. The individual stacked microelectronic devices 150 can be separated from one another by cutting through the encapsulant material 158 in the intervening gaps 156 and through the wafer 110 along lines A-A. After singulation, known bad stacked devices 150b can be discarded.

The embodiment of the stacked devices 150 illustrated in FIG. 1 have an ultra-thin profile enabled by the thin final thicknesses $T_1$ and $T_2$ of both of the individual stacked dies 120 and 140. As previously described, there is a continuous drive among semiconductor manufacturers to reduce the "footprint" and height of semiconductor components. In conventional devices, both the first and second dies are fully thinned to their final thicknesses at the wafer level using temporary carriers for supplying structural support during back grinding and other thinning techniques. In conventional devices, the fully thinned second dies are accordingly singulated and stacked on corresponding first dies at their final thickness. The present inventor recognized that handling the second dies after thinning and singulation is challenging because the thinned individual second dies are fragile and subject to breaking. Consequently, conventional second or top dies are not thinned to final thicknesses less than 300 microns. Following discovery of this problem and the limitations of conventional techniques, the present inventor developed new processes for forming stacked die assemblies 100 with top dies substantially less than 300 microns thick.

Figure 2C:
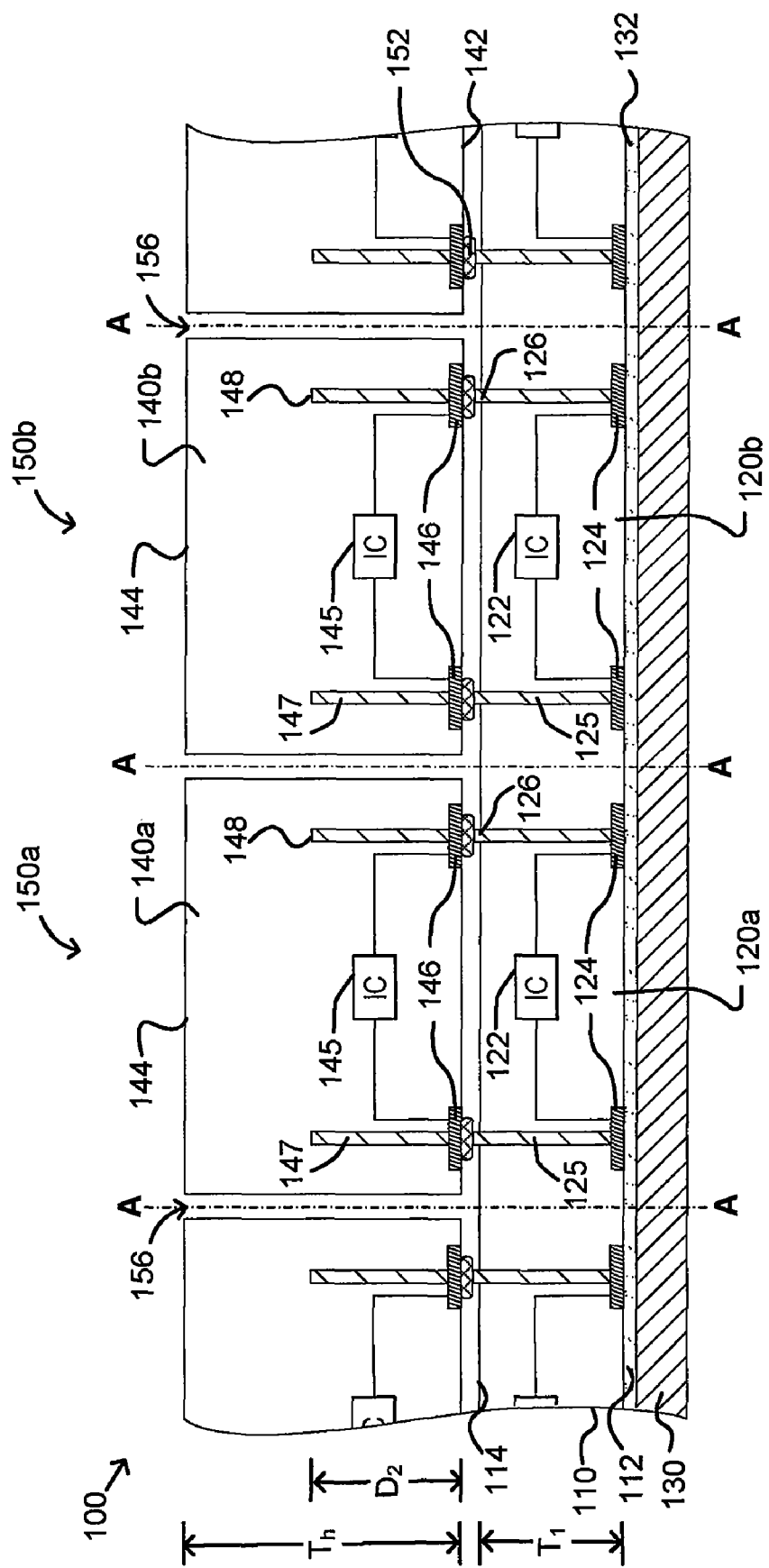

FIGS. 2A-2F illustrate stages of a specific embodiment of a method for manufacturing semiconductor assemblies 100. FIG. 2A illustrates a stage of the method at which the front side 112 of the wafer 110 is releasably attached to the temporary carrier 130 by the adhesive layer 132. At this point, the wafer 110 has an initial thickness $T_i$ between the front side 112 and the back side 114. The initial thickness $T_i$ of the wafer 110 can be approximately 500 to 1000 microns (e.g., fully thick before any thinning). In other embodiments, the wafer 110 may be partially thinned before it is attached to the carrier substrate 130 (e.g., $T_i$ of approximately 300 to 700 microns). The conductive material for the through die interconnects 125 can be embedded within the substrate of the wafer 110 at an intermediate depth $D_1$ at this stage of processing.

FIG. 2B illustrates a stage after the wafer 110 has been thinned from the initial thickness $T_i$ to the desired thickness $T_1$. For example, material can be removed from the back side 114 of the wafer 110 using a suitable back grinding process in which the temporary carrier 130 and wafer 110 are mounted in a grinding machine. In the embodiment shown in FIG. 2B, material has been removed from the back side 114 of the wafer 110 to at least the intermediate depth $D_1$ to expose the first back side contacts 126 of the first through die interconnects 125. As described above with reference to FIG. 1, the thickness $T_1$ can be less than approximately 150 microns, 100 microns, or even less than approximately 50 microns. For example, the thickness $T_1$ can be about 20-150 microns. Further processing, such as etching, can remove additional material from the back side 114 of the wafer 110 such that the first contacts 126 project beyond the surface of the substrate and have an elevated stud-shape. In some embodiments, the first contacts 126 can project 5 to 10 microns beyond the surface of the back side 114 of the wafer 110.

Referring next to FIG. 2C, a plurality of singulated second dies 140 are stacked on the back side 114 of the wafer 110 and spaced apart from each other by intervening gaps 156 so that the second dies 140 are arranged in the die pattern of the first dies 120. At this stage, individual second dies 140 have a handling thickness $T_h$ between a first side 142 (e.g., the second active side 142 of FIG. 1) and a second side 144 (e.g., the second back side 144 of FIG. 1) opposite the first side 142. The second dies 140 can be full-thick when attached to the wafer 110; however, in some arrangements, the second dies 140 can be partially thinned when attached to the wafer 110. For example, the handling thickness $T_h$ can be approximately greater than 300 microns. In other embodiments the handling thickness $T_h$ can be approximately 500 to 1000 microns. The handling thickness $T_h$ of the second dies 140 is generally such that the second contacts 148 of the second through die interconnects 147 are located at an intermediate depth $D_2$ where they are not exposed on the second side 144 when the second dies 140 are stacked on the first dies 120.

The second dies 140 can be attached to corresponding first dies 120 by placing the second terminals 146 with overlaying plated pads 152 in contact with corresponding first contacts 126 and using a reflow process, or other thermal heating process, to electrically and physically couple the second dies 140 to corresponding first dies 120. As mentioned previously, the second dies 140 can be individually tested to ensure that known good second dies 140a are attached to known good first dies 120a to form known good stacked devices 150a, and that known bad second dies 140b are attached to known bad first dies 120b to form known bad stacked devices 150b.

Figure 2D:
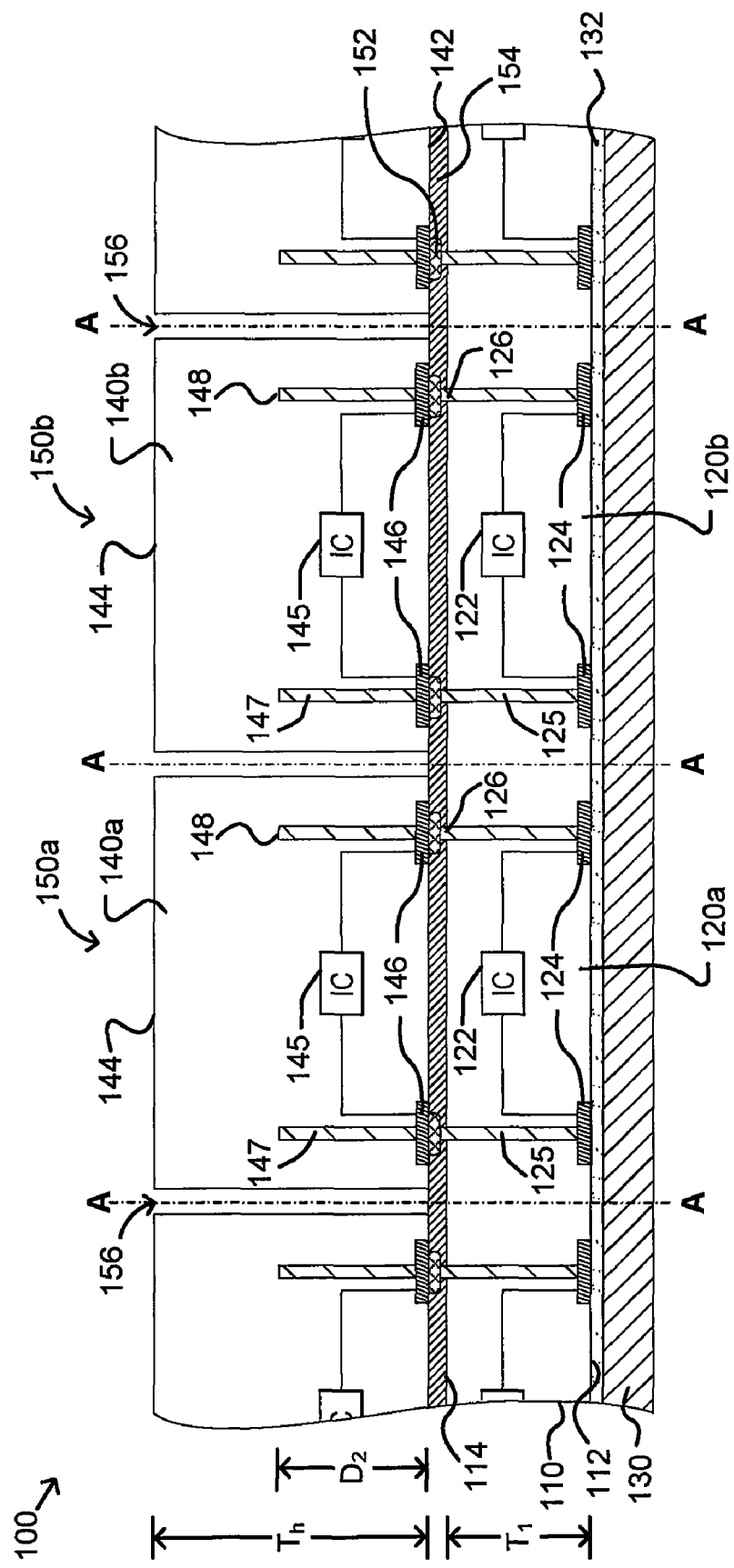
Figure 2E:
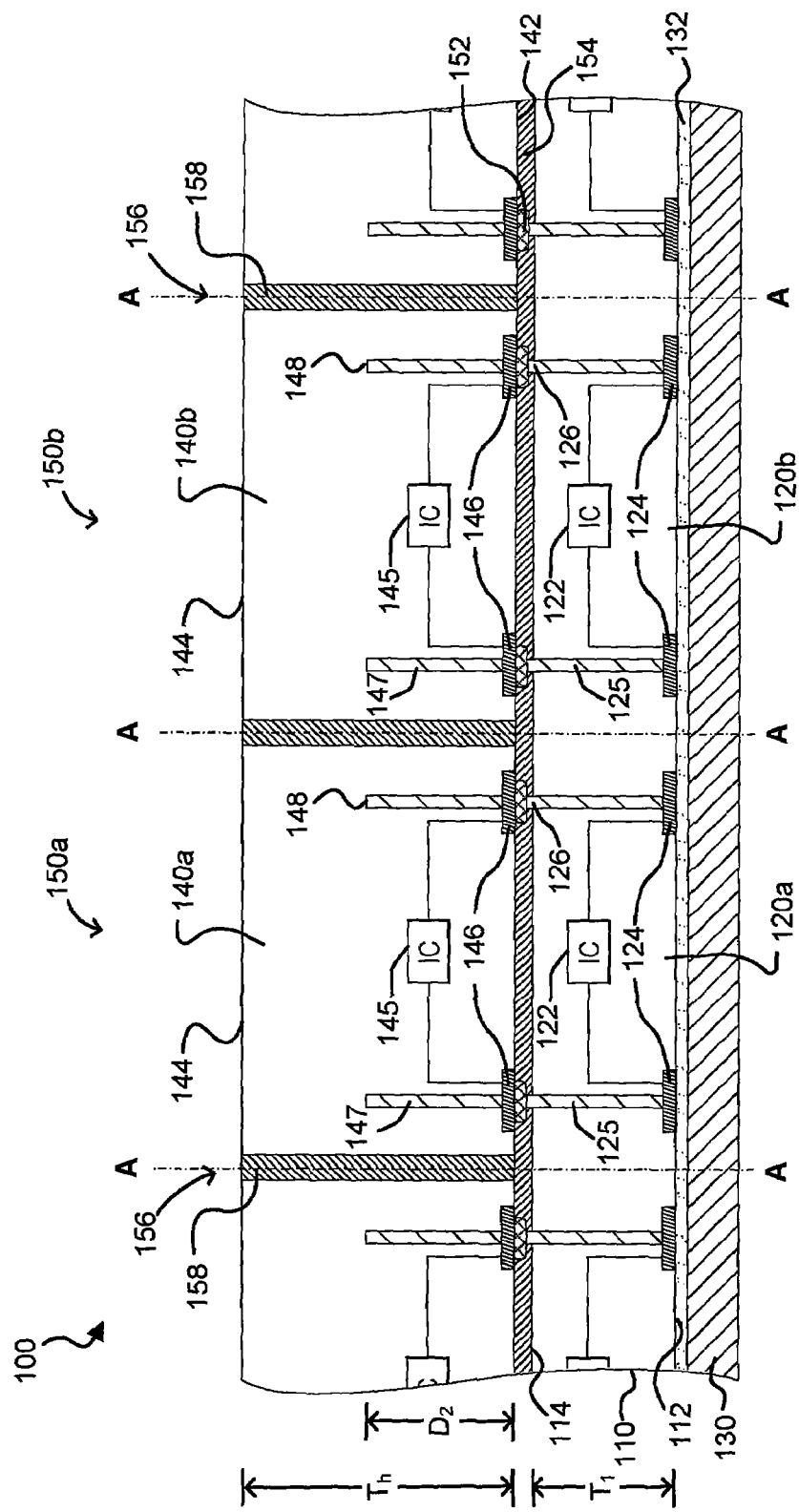

FIG. 2D illustrates a subsequent stage of the method in which the underfill material 154 has been dispensed between the thinned wafer 110 and the plurality of stacked second dies 140. Referring next to FIG. 2E, the encapsulant material 158 is deposited in the gaps 156 between the stacked second dies 140 to at least partially encapsulate the stacked microelectronic devices 150. The encapsulant material 158 can be deposited in the gaps 156 using a needle-like dispenser, stenciling, molding, a glob-type dispensing process, or other suitable technique. The encapsulant material 158 is generally a polymer or other suitable material that protects the stacked devices 150. The encapsulant material 158 can fill the gaps 156 to the extent that the encapsulant material 158 is generally co-planar or below the second side 144 of the second dies 140. The upper surface of the encapsulant material 158, however, can project above the second side 144 so long as the encapsulant material 158 does not interfere with subsequent back grinding/thinning processes.

FIG. 2F illustrates a stage of the method after the second dies 140 have been thinned from the handling thickness $T_h$ to the desired thickness $T_2$. The semiconductor assembly 100 can be mounted in a grinding machine and the second side 144 of the second dies 140 can be thinned simultaneously to the desired thickness $T_2$ using back grinding, chemical-mechanical planarization, or other suitable processes. The second dies 140 are accordingly thinned after they have been mounted to the first dies 120. Removing material from the second side 144 of the second dies 140 through a back grinding process can yield a uniform thickness $T_2$ across the plurality of second dies 140, and the underfill 154 and the encapsulant material 158 can support and protect the stacked first and second dies 120, 140 from downward forces during the grinding process.

As shown, the second dies 140 are thinned to at least the depth $D_2$ to expose the second contacts 148 of the second through die interconnects 147. As described above with reference to FIG. 1, the thickness $T_2$ can be less than approximately 150 microns, 100 microns, or in some embodiments less than approximately 50 microns. The thickness $T_2$, for example, can be about 20 to 150 microns.

After forming the semiconductor assembly 100, the temporary carrier 130 can be removed from the active side 112 of the wafer 110 and the stacked microelectronic devices 150 can be separated from each other by cutting through the encapsulant material 158 and through the wafer 110 along lines A-A. Alternatively, the temporary carrier 130 can also be cut along lines A-A and be removed from the stacked devices 150 following separation of the stacked devices 150. Furthermore, the known bad stacked devices 150b can be discarded following the separation process.

Figure 3:
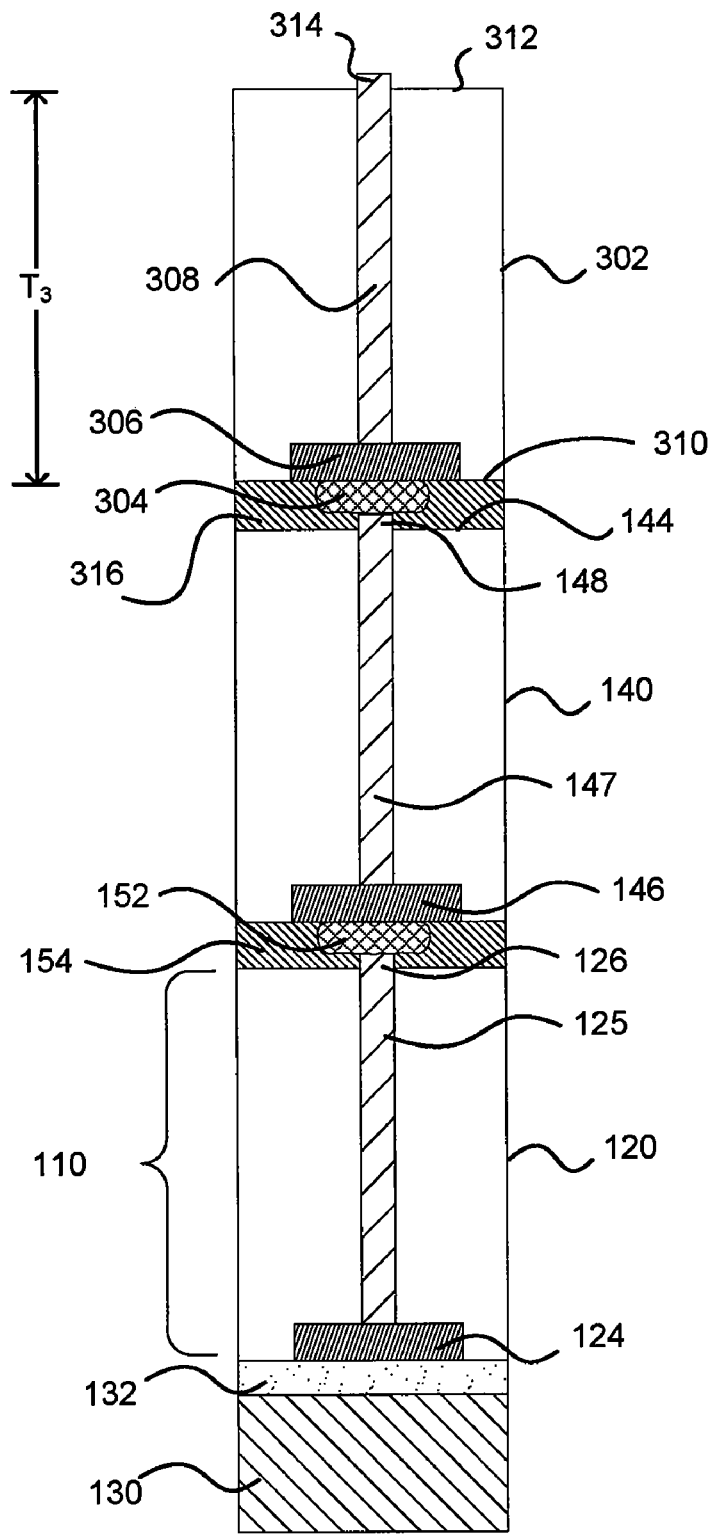
FIG. 3 is a cross-sectional view of a portion of a stacked device as shown in FIG. 2F illustrating three stacked microelectronic dies.

The second contacts 148 can also provide electrical connections for additional stacked dies such that an additional plurality of dies (not shown) can be mounted on the second dies 140 followed by a simultaneous thinning process as described above. For example, FIG. 3 illustrates a portion of the semiconductor assembly 100 (indicated in broken lines in FIG. 2F) with a third die 302 attached to the second side 144 of the second die 140. FIG. 3 shows an enlarged portion of the first through die interconnect 125 extending through the wafer 110 to the first contact 126 which is bonded to the plated pad 152. Power and signals can then be routed through the second terminal 146 and the second through die interconnect 147 to the second contact 148. The second contact 148 can then be bonded to a second plated pad 304 which is electrically connected to a third terminal 306 and a third through die interconnect 308.

In the illustrated embodiment, the third through die interconnect 308 extends from a front side 310 of the third die 302 to a back side 312 of the third die 302 and culminates in a third contact 314 on the back side 312 of the third die 302. Additional underfill material 316 can be dispersed between the second and third dies 140, 302. Furthermore, the third die 302 can have an initial thickness (not shown) that can be thinned to a desired thickness $T_3$ through a back grinding process after the third die 302 has been attached to the second die 140. In one embodiment, the desired thickness $T_3$ is less than approximately 150 microns, 100 microns, or 50 microns. The thickness $T_3$ can accordingly be about 20 to 150 microns.

Figure 4:
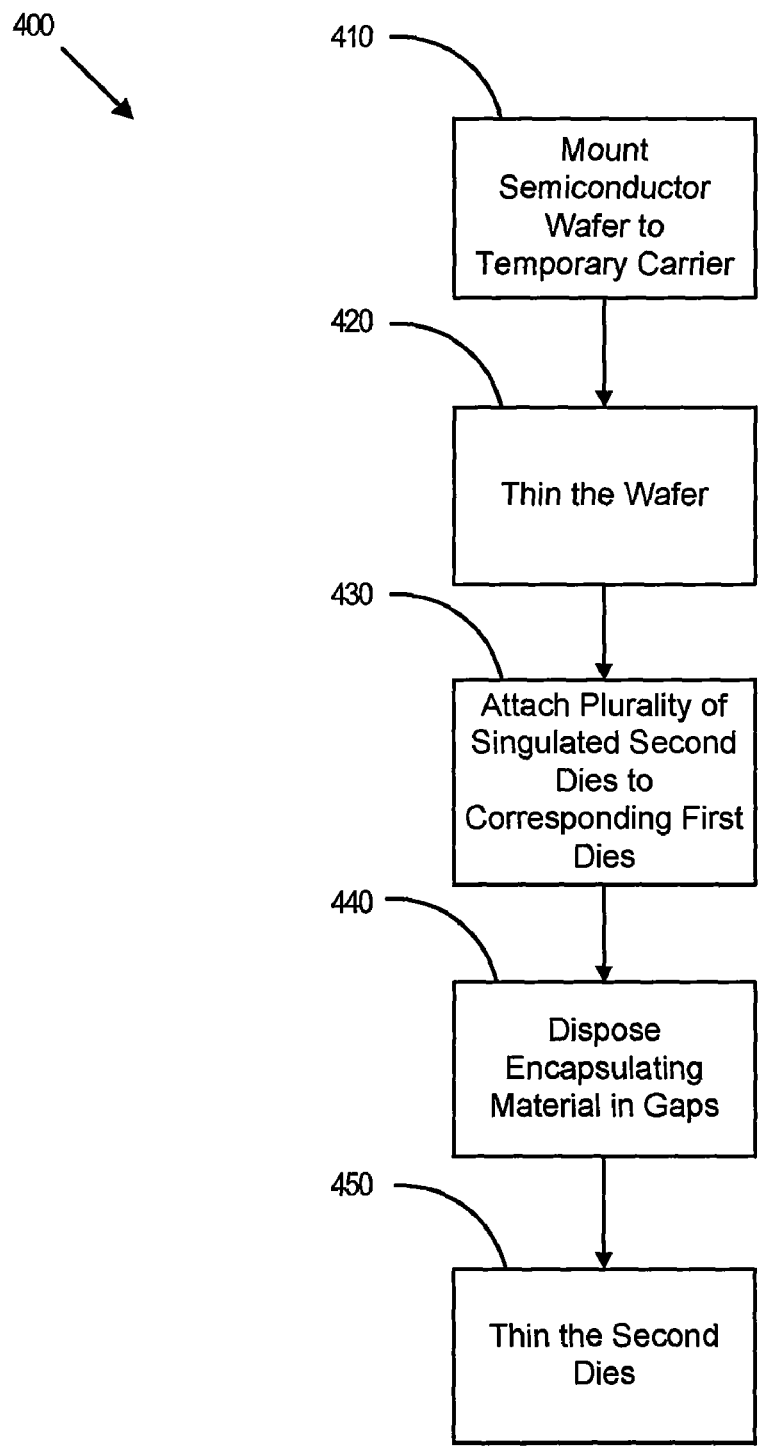
FIG. 4 is a flow chart illustrating a method for manufacturing stacked die semiconductor assemblies.

FIG. 4 is a flow chart of an embodiment of a method 400 for manufacturing stacked semiconductor assemblies. The method 400 can include mounting a semiconductor wafer to a temporary carrier (block 410). The wafer can have a plurality of first dies arranged in a die pattern on the wafer. The method 400 can further include thinning the wafer (block 420). Additionally, the method 400 can include attaching a plurality of singulated second dies to corresponding first dies, wherein the second dies are arranged in the die pattern and spaced apart from each other by gaps (block 430). After attaching the second dies to the first dies, the method 400 can further include disposing encapsulating material in the gaps between the second dies (block 440) and thinning the second dies (block 450).

Figure 5:
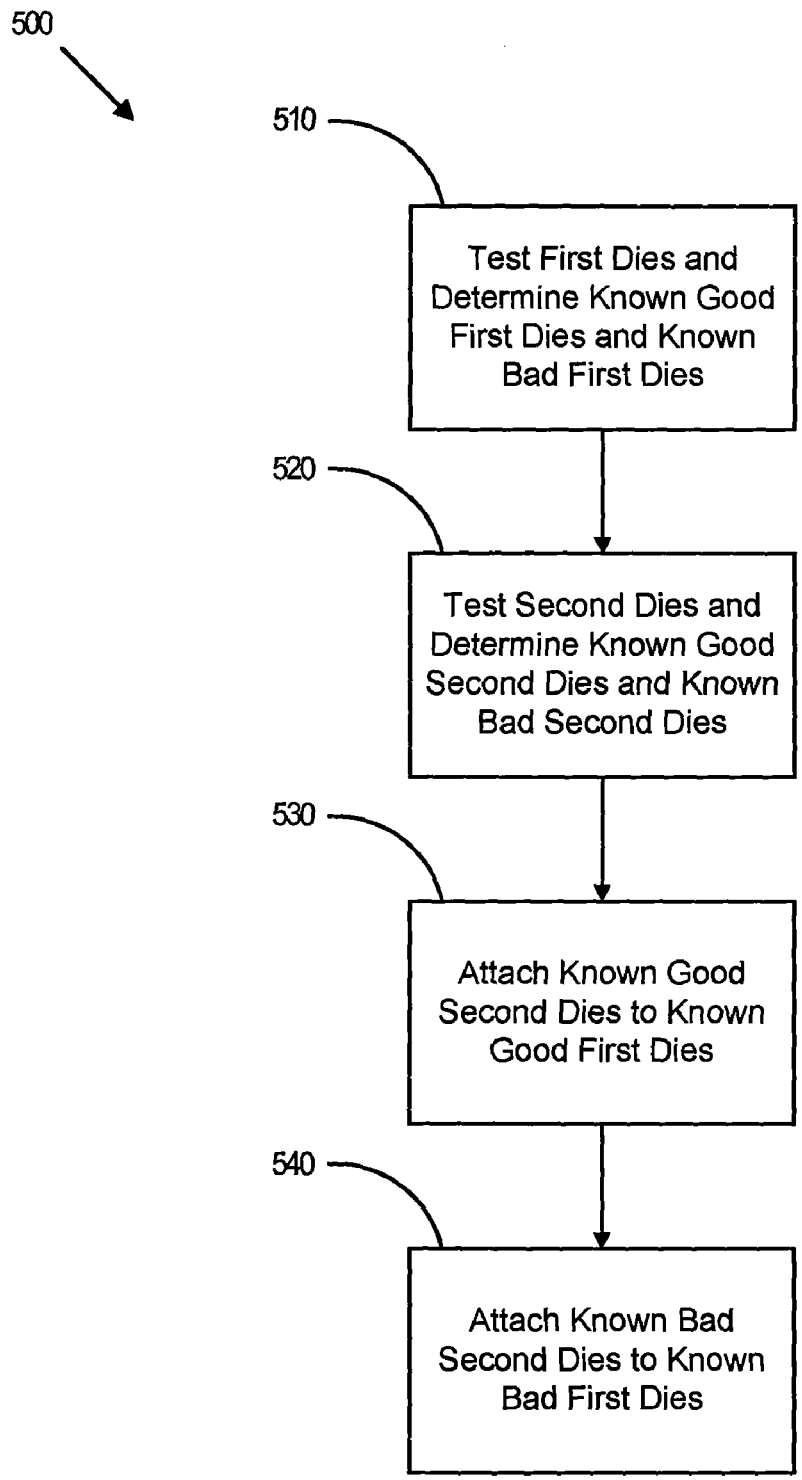
FIG. 5 is a flow chart illustrating another method for manufacturing stacked die semiconductor assemblies.

FIG. 5 is a flow chart of another embodiment of a method 500 for manufacturing stacked semiconductor assemblies. The method 500 can include testing a plurality of first dies to determine known good first dies and known bad first dies (block 510). The method 500 can also include testing a plurality of second dies to determine known good second dies and known bad second dies (block 520). Additionally, the method 500 can include attaching known good second dies to known good first dies to form a plurality of good stacked devices (block 530). Furthermore, the method 500 can include attaching known bad second dies to known bad first dies to form a plurality of bad stacked devices (block 540).

The illustrated embodiment of the stacked first and second dies 120, 140 can be thinned to a greater degree than devices manufactured using conventional die stacking techniques. For example, by stacking the second dies 140 onto the first dies 120 while the second dies 140 are sufficiently thick to be handled without breaking, and then subsequently thinning the second dies 140, both the first and second dies 120, 140 can be thinned to less than 300 microns in the final device (e.g., 20-150 microns). Furthermore, in some arrangements, several layers of dies can be added while at a robust thickness and then be thinned. Because of the extreme thinness of the stacked dies, several layers (e.g. three, four, five, etc.) of dies can be stacked to form multi-layer stacked microelectronic devices in a low-profile package.

The individual first and second dies 120, 140 can also be tested before stacking the dies. Defective dies (known bad dies) can be detected and stacked together so that entire defective stacked devices 150b can be discarded. Also, by stacking the singulated known bad second dies 140b onto known bad first dies 120b, the second known bad dies 140b can support a polishing or grinding pad to enable wafer-level thinning after stacking the second dies 140 onto the first dies 120. The throughput of good stacked devices 150a can accordingly be increased because the individual known good dies will only populate other known good dies.

The illustrated embodiments of microelectronic devices 150 also enable a wide range of mounting parameters that can be used during the manufacturing process, including a wide variety of suitable underfill materials 154. The electrical connections between first contacts 126 and the plated pads 152 can be enhanced compared to connections made from stacking pre-thinned second dies. For example, because the handling thickness $T_h$ is large, the second dies 140 are quite strong and can withstand high down forces when mounting the thick second dies 140 to the corresponding first dies 120. Moreover, the down forces exerted during the thinning of the second dies 140 also press the second dies 140 against the first dies 120. The high down forces produce better connections to avoid undesirable disconnects.

Figure 6:
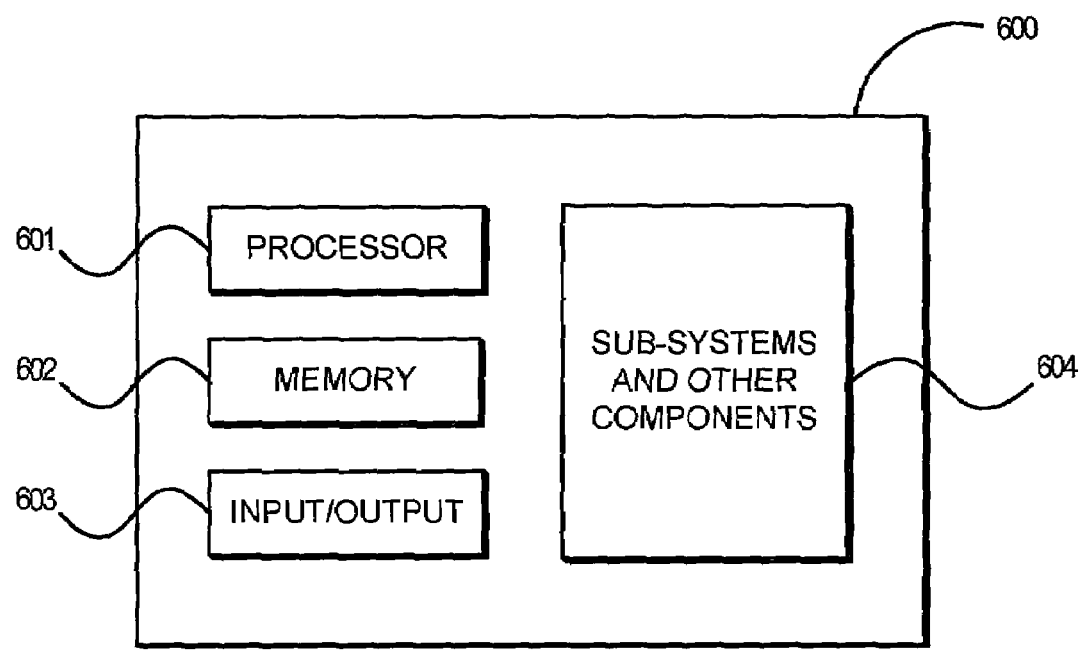
FIG. 6 is a schematic view of a system that incorporates stacked semiconductor devices.

FIG. 6 illustrates a system 600 that includes a stacked semiconductor device as described above with reference to FIGS. 1-5. More specifically, a stacked semiconductor device as described above with reference to FIGS. 1-5 can be incorporated into any of a myriad of larger and/or more complex systems, and the system 600 is merely a representative sample of such as system. The system 600 can include a processor 601, a memory 602 (e.g., SRAM, DRAM, flash, or other memory devices), input/output devices 603, and/or subsystems and other components 604. The stacked semiconductor devices may be included in any of the components shown in FIG. 6. The resulting system 600 can perform any of a wide variety of computing processing, storage, sensing, imaging, and/or other functions. Accordingly, the system 600 can be, without limitation, a computer and/or other data processor, for example, a desktop computer, laptop computer, Internet appliance, hand-held device, multi-processor system, processor-based or programmable consumer electronic, network computer, and/or mini-computer. Suitable hand-held devices for these systems can include palm-type computers, wearable computers, cellular or mobile phones, personal digital assistants, etc. The system 600 can further be a camera, light or other radiation sensor, server and associated server subsystems, and/or any display device. In such systems, individual dies can include imager arrays, such as CMOS imagers. Components of the system 600 may be housed in a single unit or distributed over multiple, interconnected units (e.g., though a communications network). The components of the system 600 can accordingly include local and/or remote memory storage devices and any of a wide variety of computer-readable media.

From the foregoing, it will be appreciated that specific embodiments of the invention have been described herein for purposes of illustration, but that various modifications may be made without deviating from the spirit and scope of the invention. For example, specific elements of any of the foregoing embodiments can be combined or substituted for elements in other embodiments. Accordingly, the invention is not limited except as by the appended claims.

I claim:

1. A method of manufacturing stacked semiconductor assemblies, comprising:
    mounting a semiconductor wafer to a temporary carrier wherein the semiconductor wafer has a plurality of first dies arranged in a die pattern on the semiconductor wafer, the individual first dies having a first terminal at a first side and a through-die interconnect in contact with the first terminal and extending from the first side towards a second side of the semiconductor wafer, wherein the through-die interconnects are spaced apart from the second side of the semiconductor wafer;
    thinning the semiconductor wafer to expose the through-die interconnects at the second side;
    attaching a plurality of singulated second dies to corresponding first dies, wherein the second dies are arranged in the die pattern and spaced apart from each other by gaps, the individual second dies having a second terminal in contact with one of the exposed through-die interconnects;
    disposing an encapsulating material in the gaps between the second dies; and
    thinning the second dies after attaching the second dies to the first dies.

2. The method of claim 1 wherein thinning the second dies includes grinding a back side of the second dies.

3. The method of claim 1, further comprising cutting through the encapsulating material in the gaps and cutting the semiconductor wafer to singulate stacked microelectronic devices having a first die and a corresponding second die.

4. The method of claim 1 wherein:
    before mounting the semiconductor wafer to the temporary carrier, the method further comprises forming the through-die interconnects in at least a portion of the individual first dies in electrical contact with the first terminal; and
    attaching the second dies to the first dies further comprises electrically coupling the second terminals of the second dies to corresponding exposed through-die interconnects.

5. The method of claim 1 wherein:
    before attaching the plurality of second dies to corresponding first dies, the method further comprises testing individual first dies and individual second dies to determine known good first and second dies and known bad first and second dies; and
    attaching the second dies to corresponding first dies comprises attaching known good second dies to known good first dies and attaching known bad second dies to known bad first dies to form a plurality of known good stacked devices and a plurality of known bad stacked devices.

6. The method of claim 1, further comprising:
    attaching singulated third dies to corresponding second dies such that the third dies are spaced apart from each other by gaps;

disposing additional encapsulant material in the gaps between the third dies; and removing material from a back side of the third dies after disposing the encapsulant material in the gaps between the third dies.

7. The method of claim 1 wherein the individual second dies have a handling thickness when the second dies are attached to the first dies, and thinning the second dies comprises reducing the thickness of the second dies to about 20-150 microns.

8. The method of claim 1 wherein the individual second dies have a handling thickness when the second dies are attached to the first dies, and thinning the second dies comprises reducing the thickness of the second dies to less than 100 microns.

9. The method of claim 1 wherein the semiconductor wafer has an initial thickness before thinning of approximately 700-1000 microns, and thinning the semiconductor wafer comprises reducing the thickness to approximately less than 50 microns, wherein the individual second dies have a handling thickness greater than 150 microns when the second dies are attached to the first dies, and thinning the second dies comprises reducing the thickness of the second dies to about 20-150 microns.

10. The method of claim 1 wherein the through-die interconnects of adjacent first dies are spaced apart from one another.

11. The method of claim 1, further comprising keeping the semiconductor wafer mounted to the temporary carrier while thinning the semiconductor wafer, attaching the plurality of singulated second dies to corresponding first dies, disposing the encapsulating material in the gaps between the second dies, and thinning the second dies.

12. A method of manufacturing semiconductor workpieces, comprising:

reducing an initial thickness of a semiconductor wafer between a front side of the wafer and a back side of the wafer, wherein the semiconductor wafer has a plurality of first dies individually having a first terminal and first interconnects in contact with the first terminal and extending between the front side and the back side of the semiconductor wafer, wherein the first interconnects are spaced apart from the back side of the semiconductor wafer;

exposing the first interconnects at the back side via reducing the initial thickness of the semiconductor wafer;

mounting a plurality of separated second dies to corresponding first dies in a stacked configuration to form a plurality of stacked microelectronic devices, wherein individual second dies have second interconnects connected to second terminals on a first side of the second die and extending to an intermediate level such that the second interconnects are not exposed on a second side of the second die opposite the first side, the second terminals being in contact with one of the exposed first interconnects;

at least partially encapsulating the stacked devices; and thinning the second dies and exposing the second interconnects on the second side after at least partially encapsulating the stacked devices.

13. The method of claim 12 wherein reducing the initial thickness of the semiconductor wafer comprises reducing the initial thickness between the front side and the back side to approximately less than 100 microns, and wherein thinning the second dies comprises reducing a second die thickness between the first and second sides to less than 300 microns.

14. The method of claim 13 wherein:

before mounting the plurality of second dies to corresponding first dies, the method further comprises testing individual first dies and individual second dies to determine known good first and second dies and known bad first and second dies; and mounting the second dies to corresponding first dies comprises mounting known good second dies to known good first dies arranged in a stacked configuration and mounting known bad second dies to known bad first dies arranged in a stacked configuration to form a plurality of known good stacked devices and known bad stacked devices.

15. The method of claim 12 wherein thinning the second dies comprises simultaneously thinning the second dies to a thickness between the first and second sides of approximately less than 300 microns.

16. The method of claim 12 wherein:

before encapsulating the stacked devices, the method further comprises dispensing an underfill material between the second dies and the semiconductor wafer; and thinning the second dies includes grinding the second sides of the second dies while in a stacked configuration.

17. The method of claim 13 wherein the initial thickness of the semiconductor wafer is approximately 500-1000 microns and the second die has a thickness of approximately 500-1000 microns after the mounting stage but before the thinning stage.

18. A method of manufacturing semiconductor assemblies, the method comprising:

forming first and second semiconductor wafers having front sides and back sides opposite the front sides and an array of dies at the front sides arranged in a die pattern, the individual dies including an integrated circuit and a terminal electrically coupled to the integrated circuit;

forming a plurality of interconnects in electrical contact with the die terminals on the first and second wafers;

attaching a carrier substrate to the front side of the first wafer;

processing the back side of the first wafer to form a thinned base wafer with exposed interconnect studs at the back side of the first wafer;

dividing the second wafer to form singulated second dies;

populating the first dies with singulated second dies to form an array of stacked semiconductor devices in the die pattern, the terminals on the front side of the second dies being in contact with one of the exposed interconnect studs on the first wafer, wherein the terminals on the front side of the second dies are electrically coupled with the corresponding interconnect studs of the first dies;

at least partially encapsulating the stacked devices; and grinding the back side of the second dies after encapsulating the stacked devices.

19. The method of claim 18 wherein:

before populating the first dies with the second dies, the method further comprises testing individual first dies and second dies to determine known good first and second dies and known bad first and second dies; and populating the first dies with second dies comprises attaching known good second dies to known good first dies arranged in a stacked configuration and attaching known bad second dies to known bad first dies arranged in a stacked configuration to form a plurality of known good stacked devices and known bad stacked devices.

20. A method of manufacturing semiconductor assemblies, the method comprising:
- attaching a first front side of a first semiconductor wafer to a carrier substrate, the first semiconductor wafer having an array of first dies at the first front side and arranged in a die pattern, the individual first dies having a first terminal at the first front side and a first interconnect in contact with the first terminal and extending between the first front side and a first back side of the semiconductor wafer, wherein the first interconnects are spaced apart from the first back side of the semiconductor wafer;
- removing material from the first back side of the first semiconductor wafer until the first interconnects at the first back side is exposed, the first back side being opposite the first front side;
- singulating a second wafer into a plurality of singulated second dies individually having a second terminal at a second front side and a second back side opposite the second front side;
- stacking the singulated second dies onto the individual first dies with the second front side facing the first back side of the first semiconductor wafer with the second terminal in contact with one of the exposed first interconnects;
- at least partially encapsulating the stacked first and second dies; and
- removing material from the second back side of the second dies after encapsulating the stacked first and second dies to achieve a target thickness of the second dies.

21. The method of claim 20 wherein removing material from the second back side includes grinding the second back side of the second dies.

22. The method of claim 20, further comprising cutting through the encapsulating material and the first semiconductor wafer to singulate stacked microelectronic devices individually having one of the first dies and one of the corresponding second dies.

23. The method of claim 20 wherein:
- stacking the singulated second dies comprises electrically coupling the second terminals at the second front side of the second dies to the corresponding first interconnect of the first dies exposed at the first back side of the first semiconductor wafer.

24. The method of claim 20, further comprising:
- attaching a third front side of individual singulated third dies to the corresponding second back side of the second dies;
- at least partially encapsulating the first, second, and third dies with an additional encapsulant; and
- removing material from a third back side of the third dies after at least partially encapsulating the first, second, and third dies, the third back side being opposite the third front side.

25. The method of claim 20 wherein removing material from the second back side of the second dies includes removing material from the second back side of the second dies after encapsulating the stacked devices to achieve a target thickness of about 20-150 microns.

26. The method of claim 20 wherein removing material from the second back side of the second dies includes removing material from the second back side of the second dies after encapsulating the stacked devices to achieve a target thickness of about less than 100 microns.

27. The method of claim 20 wherein:
- the first semiconductor wafer has a first thickness of approximately 700-1000 microns prior to removing material from the first back side of the first semiconductor wafer;
- removing material from the first back side of the first semiconductor wafer includes reducing the thickness of the first semiconductor wafer to approximately less than 50 microns;
- the individual second dies have a second thickness greater than 150 microns when the singulated second dies are stacked onto the individual first dies; and
- removing material from the second back side of the second dies comprises reducing the second thickness of the second dies to about 20-150 microns.

* * * * *